(12) United States Patent
Winter et al.

(10) Patent No.: US 6,987,417 B2
(45) Date of Patent: Jan. 17, 2006

(54) POLAR AND LINEAR AMPLIFIER SYSTEM

(75) Inventors: Frank Winter, San Diego, CA (US); Ian Robinson, Venice, CA (US); Walter DeMore, San Diego, CA (US)

(73) Assignee: Northrop Grumman Corpoation, Los Angeles, CA (US)

(*) Notice: Subject to any disclaimer, the term of this patent is extended or adjusted under 35 U.S.C. 154(b) by 8 days.

(21) Appl. No.: 10/606,093

(22) Filed: Jun. 24, 2003

(65) Prior Publication Data

US 2004/0263245 A1 Dec. 30, 2004

(51) Int. Cl.
*H03F 3/38* (2006.01)

(52) U.S. Cl. .................................. 330/10; 330/297
(58) Field of Classification Search ............... 330/10, 330/297, 149, 107, 136
See application file for complete search history.

(56) References Cited

U.S. PATENT DOCUMENTS

| | | | |
|---|---|---|---|
| 4,446,440 A | * | 5/1984 | Bell .......................... 330/10 |
| 4,630,315 A | * | 12/1986 | Watkinson .................. 455/109 |
| 6,043,707 A | | 3/2000 | Budnik |
| 6,101,224 A | | 8/2000 | Lindoff et al. |
| 6,118,343 A | | 9/2000 | Winslow |
| 6,141,541 A | | 10/2000 | Midya et al. |
| 6,256,482 B1 | | 7/2001 | Raab |
| 6,392,484 B1 | * | 5/2002 | Takita .......................... 330/251 |
| 6,407,634 B1 | | 6/2002 | Staudinger et al. |
| 6,445,247 B1 | | 9/2002 | Walker |
| 6,873,211 B1 | | 3/2005 | Thompson |
| 2004/0071225 A1 | | 4/2004 | Suzuki et al. |

OTHER PUBLICATIONS

F. Raab, et al., "L–Band Transmitter Using Kahn EER Technique", IEEE Transactions on Microwave Theory and Techniques, vol. 46, No. 12, Dec. 1998, pp. 2220–2225.
Bernard Sklar, "Digital Communications, Fundamentals and Applications", $2^{nd}$ Edition, Prentice Hall, 2001, pp. 204–205, eq. 4.63.
Raab, "Intermodulation Distortion in Kahn–Technique Transmitters", IEEE Transactions on Microwave Theory and Techniques, vol. 44, No. 12, Dec. 1996, pp. 2273–2278.
New U.S. Robinson, et al. patent application entitled "Multi–Mode Multi–Amplifier Architecture", filed Jun. 24, 2003.
New U.S. Robinson, et al. patent application entitled "Multi–Mode Amplifier System", Filed Jun. 24, 2003.
European Search Report for EP 03 025 799.2, completed Aug. 6, 2004.

* cited by examiner

*Primary Examiner*—Patricia Nguyen
(74) *Attorney, Agent, or Firm*—Tarolli, Sundheim, Covell & Tummino L.L.P.

(57) ABSTRACT

An amplifier system is provided that switches between operation in a polar mode and a linear mode based on a characteristic of an input signal relative to a threshold level. The system operates as a polar amplifier in the polar mode, and as a linear amplifier in the linear mode. A mode selector controls whether polar components of the input signal are sent to a power amplifier or whether a composite signal is amplified.

27 Claims, 7 Drawing Sheets

POLAR AND LINEAR AMPLIFIER SYSTEM

TECHNICAL FIELD

The present invention relates generally to electronic devices, and more particularly to a polar and linear amplifier system.

BACKGROUND OF THE INVENTION

RF power amplifiers used for wireless communication transmitters, with spectrally efficient modulation formats, require high linearity to preserve modulation accuracy and to limit spectral regrowth. Typically, a linear amplifier, Class-A type, Class-AB type or Class-B, is employed to faithfully reproduce inputs signals and to limit the amplifier output within a strict emissions mask. Linear amplifiers are capable of electrical (DC power in to RF power out or DC-RF) efficiencies greater than 50% when operated at saturation. However, they are generally not operated at high efficiency due to the need to provide high linearity. For constant envelope waveforms, linear amplifiers are often operated below saturation to provide for operation in their linear regime. Time varying envelopes present an additional challenge. The general solution is to amplify the peaks of the waveform near saturation, resulting in the average power of the waveform being amplified at a level well backed-off from saturation. The back-off level, also referred to as output power back-off (OPBO), determines the electrical efficiency of a linear amplifier.

For example, the efficiency of a Class-A type amplifier decreases with output power relative to its peak value (EFF=$P_{OUT}/P_{PEAK}$). The efficiency of Class-B type amplifiers also decreases with output power relative to its peak value (EFF=$(P_{OUT}/P_{PEAK})^{1/2}$). Class-AB type amplifiers have output power variations intermediate between these values. Thus, there is customarily an inherent tradeoff between linearity and efficiency in amplifier designs.

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band emissions from occurring into adjacent channels but produces time-varying envelopes. In addition to amplifying individual waveforms with time varying envelopes, many transmitters (especially in base stations) are being configured to amplify multiple carriers. Multi-carrier signals have high a wide distribution of power levels resulting in a large peak-to-average ratio (PAR). Therefore, the operation of the linear amplifiers in these types of signals is very inefficient, since the amplifiers must have their supply voltage sized to handle the large peak voltages even though the signals are much smaller a substantial portion of the time. Additionally, the size and cost of the power amplifier is generally proportional to the required peak output power of the amplifier.

Wideband Code Division Multiple Access (WCDMA), Orthogonal Frequency Division Multiplexing (OFDM), and multi-carrier versions of Global Standard for Mobile Communication (GSM) and Code Division Multiple Access 2000 (CDMA 2000) are wireless standards and application growing in use. Each requires amplification of a waveform with high PAR levels, above 10 dB in some cases. The sparse amount of spectrum allocated to terrestrial wireless communication requires that transmissions minimize out-of-band (OOB) emissions to minimize the interference environment. A linear amplifier used to amplify a waveform with a PAR of 10 dB or more provides only 5–10% DC-RF efficiency. The peak output power for the amplifier is sized by the peak waveform. The cost of the amplifier scales with its, peak power. Several other circuit costs including heat sinks and DC-DC power supplies scale inversely to peak power and dissipated heat (which results from the electrical inefficiency). Related base station costs of AC-DC power supplies, back-up batteries, cooling, and circuit breakers also scale inversely with efficiency as does the electrical operating costs. Clearly, improving DC-RF efficiency is a major cost saver both for manufacturing and operation.

Non-linear classes (e.g., Class C, D, E and F type amplifiers) of RF power amplifiers switch the RF devices on and off in or near saturation, and are more efficient than linear classes of operation such as Class-A, Class-AB or Class-B type which conduct during at least half of the RF cycle and are significantly backed off from compression. However, non-linear amplifiers can only be employed with constant envelope signals, such as frequency modulations (FM) and certain forms of phase modulation (PM), signals with modulated amplitudes cause severely distorted outputs from these classes of amplifiers.

One efficiency enhancement technique that has been employed is known as the Kahn or Envelope Elimination and Restoration (EER) technique. The EER technique detects the envelope of the incoming signal to produce a baseband amplitude modulated (AM) signal. The EER technique limits the input signal to produce a phase modulated (PM) component with a constant envelope. The PM signal is provided to the input of the power amplifier along a PM path and the amplitude modulated component is employed to modulate the supply of the power amplifier along an AM path. Amplitude modulation of the final RF power amplifier restores the envelope to the phase-modulated carrier, creating an amplified version of the input signal. Since the signal input into the power amplifier has a constant envelope amplitude, a more efficient class of power amplifier (e.g., Class-C type amplifiers) can be employed to amplify the input signal. Additionally, since the supply signal is amplitude modulated, the amplifier is operating at compression enhancing the efficiency of the amplifier.

Amplifiers that employ the EER technique are referred to as polar amplifiers. Polar amplifiers have demonstrated very high efficiency but can distort signals and cause significant amounts of OOB emissions. Traditional implementations require the two signal paths (AM and PM) to be extremely well synchronized. The two paths may each require substantially wider bandwidth components than the original signal. If the signal crosses through a zero-amplitude point it may cause the polar amplifier to cut-off and/or require an extremely rapid and difficult phase change in the constant envelope, PM, path. If the signal varies over a large dynamic range it may cause the polar amplifier to operate with very low supply (e.g., drain) voltages resulting in additional signal distortion and can cause the amplifier to shutoff when the supply voltage becomes too low. As a result, the polar amplifier has only been employed with a limited range of waveforms. In traditional EER systems, OOB emissions have been controlled by calibrating the delay along the two paths to synchronize the reconstitution of the signal and by detecting the envelope of the output and supplying feedback to the path amplifying the envelope (the AM path).

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to an amplifier system that switches modes of operation between a polar mode and a linear mode based on a characteristic of an input signal relative to a threshold level (e.g., envelope amplitude threshold level, digital count representation of signal level, power amplifier power level or the like). In the polar mode, the input signal is decomposed to form two terms whose product is proportional to the input signal. One component is a substantially constant envelope, phase modulated component of the input signal that is transmitted to the input terminal of a power amplifier. The second component is an amplitude modulated component of the input signal that is transmitted to the supply terminal of the power amplifier. In the linear mode, a composite (product) signal component is transmitted to the input terminal and a substantially constant amplitude signal is transmitted to the supply terminal. For example, if the threshold level is set by the envelope amplitude level, the amplifier system operates in the polar mode for envelope amplitude levels above (or at) the threshold level and in the linear mode for envelope amplitude levels below (or at) the threshold level.

In one aspect of the invention, a digital component, such as a mode selector determines whether the composite signal (linear mode) or the polar components of the composite signal (polar mode) are to be transmitted to the power amplifier. The mode selector can comprise a digital hardware device such as programmable logic device, field programmable gate array, discrete logic devices, or an algorithm executed on a digital signal processor (DSP), a controller, a microprocessor or the like. The mode selector can comprise a variety of different hardware and/or software components. The input signals are converted from the digital domain to the analog domain via respective digital-to-analog converters (DACs). DACs can be employed in the amplifier system that convert the input signals from the digital domain to the analog domain directly to radio transmission frequencies. The radio transmission frequencies can be in radio frequency (RF) ranges (e.g., megahertz range) or in microwave frequency ranges (e.g., gigahertz range). In another aspect of the invention, at least one of the DACs is a delta sigma modulator DAC.

In yet another aspect of the present invention, the input signal can be modified via predistortion (e.g., especially well suited to digital pre-distortion) techniques to facilitate linearization of the amplifier system and to mitigate out-of-band emissions. Separate predistortion is applied to the polar components and the composite signal. Alternatively, the output signal can be modified by a digital cross-cancellation technique that employs a separate digital reference signal to produce a "clean" version of the wanted signal used to correct distortion in the output signal. The digital cross-cancellation technique allows for modification of the input signal to improve amplifier performance (e.g., reduction of signal peak levels) that can be corrected at the output of the power amplifier. The predistortion technique and digital cross-cancellation technique can be combined to facilitate linearization and to mitigate out-of-band emissions of the amplifier system.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to an amplifier system that switches modes of operation based on a characteristic of an input signal relative to a threshold level (e.g., envelope amplitude level, digital count representation of signal level, power amplifier power level). The amplifier system operates as a polar amplifier system in a polar mode, and operates as a linear amplifier system (e.g., Class A, A/B, or B) in a linear mode. The amplifier system integrates digital functions with analog components to achieve improved linearity and size reduction of power amplifiers. A mode selector controls whether polar components ("polar mode") of the signal are sent to a power amplifier or whether the composite signal is amplified ("linear mode"). The amplifier system can employ a power amplifier that maintains a constant class configuration. However, a power amplifier that maintains a constant class configuration is not required.

The present invention overcomes one or more known obstacles in polar amplifier designs including synchronization of the two signal paths, large bandwidth requirements on each path, signal distortion due to large dynamic range of the input signal, signal distortion due to zero-crossings, and signal distortion and OOB emissions related to operating a saturated amplifier. Operating as a linear amplifier when the signal envelope is at its lower levels reduces the bandwidth required for both the AM and PM paths. Zero-crossings occur in the linear mode, and are amplified without the distortion of a polar amplifier. The use of one or more delta-sigma DACs reduces the number of components in each path, simplifying synchronization. Operating as a linear amplifier avoids problems experienced by polar amplifiers at low supply voltages.

Figure 1:
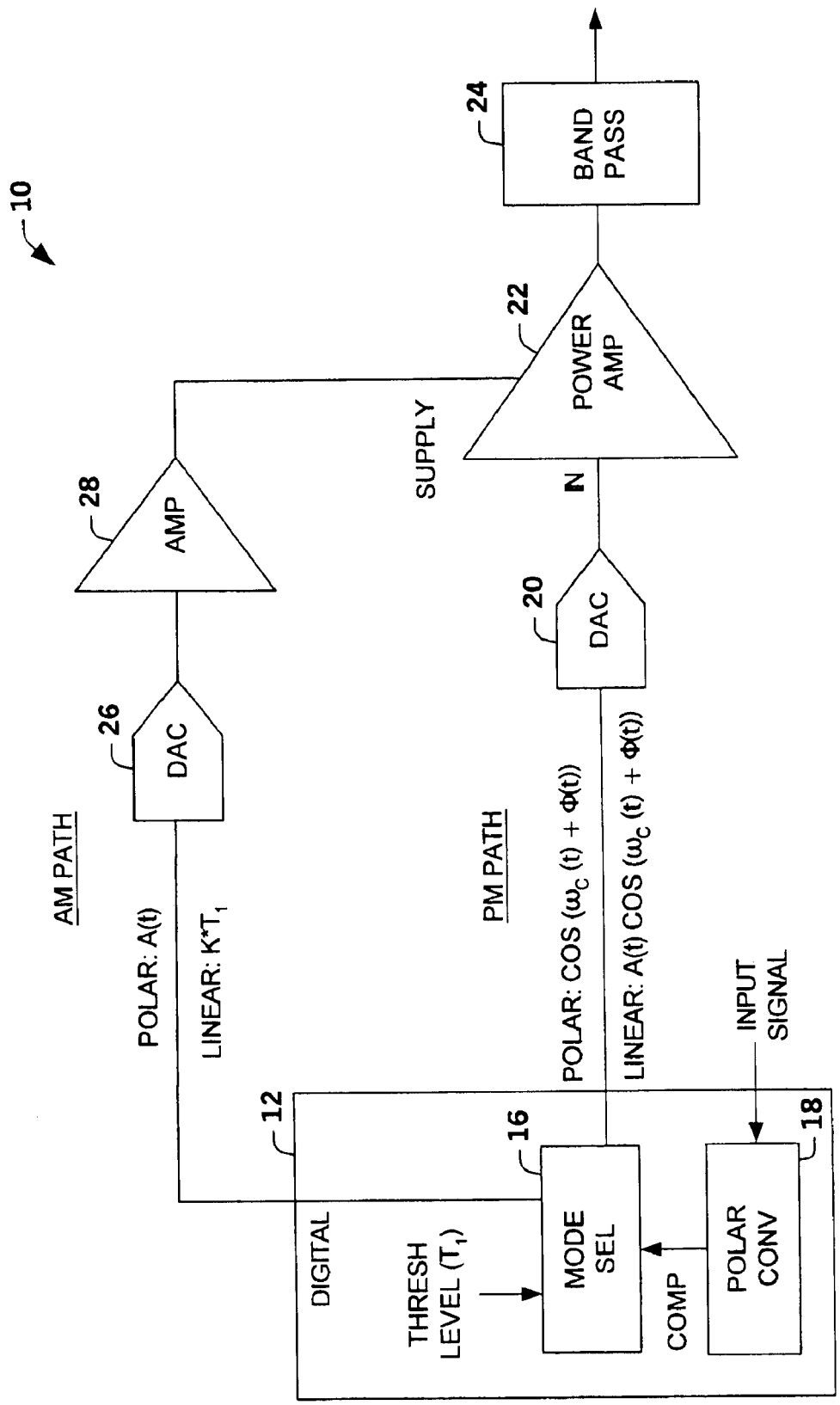
FIG. 1 illustrates a schematic block diagram of an amplifier system in accordance with an aspect of the present invention.

FIG. 1 illustrates an amplifier system 10 in accordance with an aspect of the present invention. The amplifier system 10 switches operation between a polar mode and a linear mode based on a characteristic of an input signal relative to a threshold level (e.g., envelope amplitude level, digital count representation of signal level, power amplifier power level). For example, the threshold level can be a selected envelope amplitude level or digital count corresponding to the envelope amplitude level. The amplifier system 10 can then operate in a polar mode for envelope amplitude levels between an envelope peak voltage and the threshold level and in a linear mode for envelope amplitude levels at or below the threshold level.

It is to be appreciated that the threshold level of the amplifier system can be one or more characteristics associated with the input signal based on a desired efficiency, linearity, distortion and acceptable OOB emissions of the amplifier system 10. Additionally, the threshold level can be affected by one or more characteristics associated with amplifier system fabrication technology (e.g., Gallium Arsenide (GaAs), Indium Phosphide (InP), Gallium Nitride (GaN), Silicon (Si), Laterally Diffused Metal Oxide Semiconductors (LDMOS)). Many exemplary embodiments of the present invention will be described with respect to the threshold level being a selected envelope amplitude level for illustrative purposes. However, other characteristics associated with the input signal, the power amplifier and/or the fabrication technology can be employed to control the switching of the amplifier system between a polar mode and a linear mode of operation.

The amplifier system 10 includes a digital component 12, such as an application specific integrated circuit (ASIC), field programmable gate array (FPGA), a digital signal processor (DSP) or a combination of digital hardware and/or software components. The digital component 12 includes a mode selector 16 that switches the amplifier system 10 between the polar mode and linear mode. The mode selector 16 receives a composite signal component and a polar representation of an input signal. The input signal is typically a phase and/or amplitude modulated signal which can be represented in polar form by the following equation:

$$A(t)\text{COS}(\omega_c(t)+\Phi(t)) \qquad \text{EQ. 1}$$

where A(t) is the amplitude modulated component and $\text{COS}(\omega_c(t)+\Phi(t))$ is the phase modulated component, $\phi(t)$ is the phase component and $\omega_c(t)$ is the carrier frequency. The input signal can be in a variety of different amplitude and/or phase modulated forms. It is to be appreciated that EQ. 1 illustrates a polar representation of a single carrier input signal, where the actual signal can be a multi-carrier signal.

For example, the signal can be a signal that conforms to WCDMA, multi-carrier GSM, OFDM or other signals having similar noise like signatures with high peak-to-average (PAR) ratios. The input signal can be provided to a polar converter 18 (optional) that transforms the input signal into a polar composite signal. Alternatively, the input signal can be provided in polar form directly to the mode selector 16. The mode selector 16 or the polar converter 18 can be operative to separate the composite signal into a separate phase modulated component and amplitude modulated component. The mode selector 16 also receives a threshold level $T_1$ that can be one or more fixed, selectable or programmable characteristics (e.g., envelope amplitude level) associated with the input signal.

The amplifier system 10 includes a main power amplifier 22 that includes an input terminal (IN) and a supply terminal (SUPPLY). The mode selector 16 has a first output coupled to the input terminal of the power amplifier 22 through a first digital-to-analog converter (DAC) 20 along a phase modulated (PM) path. The mode selector 16 has a second output coupled to a modulation amplifier 28 through a second DAC 26 along an amplitude modulated (AM) path. The output of the modulation amplifier 28 is coupled to the supply terminal of the main power amplifier 22. The modulation amplifier 28 is typically an efficient Class-S type or Class-G type modulator. The modulation amplifier 28 needs to be relatively efficient since the overall efficiency is proportional to its efficiency. It is to be appreciated that the modulation amplifier 28 can be a pulse width modulator, a switching amplifier or a linear amplifier based on desirable bandwidth and acceptable distortion limits. Low distortion is required because in polar mode the AM path carries an information bearing signal. The bandwidth and peak-to-peak voltage swing required are a function of Threshold level ($T_1$), where the higher the voltage level at which polar mode begins the lower the required bandwidth and voltage swing for the AM path amplifier.

The power amplifier 22 is typically a linear amplifier (e.g., Class-A, Class-AB, Class-B) since the input to the linear amplifier in the linear mode is an amplitude modulated signal. It is also to be appreciated that the power amplifier 22 can be other more efficient types of amplifiers based on desirable bandwidth and acceptable distortion limits. However, the employment of a linear amplifier provides a more desirable linear and cost effective solution.

In the polar mode, the mode selector 16 transmits, with appropriate time delay, the phase modulated component $\text{COS}(\omega_c(t)+\Phi(t))$ of the composite signal in digital form to the first DAC 20. The phase modulated component has a substantially constant signal envelope. The first DAC 20 converts the phase modulated component of the composite signal into the analog domain, which is provided to the input terminal of the main power amplifier 22. The mode selector 16 concurrently transmits the amplitude modulated component A(t) of the composite signal in digital form to the second DAC 26. The second DAC 26 converts the amplitude modulated component A(t) from the digital domain to the analog domain. The analog amplitude modulated component is then provided to the modulation amplifier 28 which amplitude modulates the supply terminal of the power amplifier 22. The output of the power amplifier 22 is a reconstructed amplified version of the composite signal. The amplified composite signal is then provided to an optional band pass filter 24 which filters out any remaining unwanted signals outside the desired transmission band.

In the linear mode, the mode selector transmits the composite signal A(t) $\text{COS}(\omega_c(t)+\Phi(t))$ in digital form to the first DAC 20. The first DAC 20 converts the composite signal into the analog domain, which is provided to the input terminal of the main power amplifier 22. The mode selector 16 concurrently transmits a signal of constant amplitude (e.g., $K*T_1$) in digital form to the second DAC 26, where $T_1$ is the threshold level and K is a constant greater than or equal to one. The second DAC 26 converts the constant amplitude signal from the digital domain to the analog domain and provides the amplified version of the constant amplitude signal to the modulation amplifier 28. The modulation amplifier 28 provides an amplified version of the constant amplitude to the supply terminal of the power amplifier 22. The output of the power amplifier 22 is a reconstructed amplified version of the composite signal. The composite signal is then provided to a band pass filter 24 which filters out any remaining unwanted signals outside the desired transmission band.

In one aspect of the invention, one or both of the first DAC 20 and the second DAC 26 are delta sigma modulated DACs. Delta Sigma modulation is a technique used to generate a coarse estimate of a signal using a small number of quantization levels and a very high sampling rate. The small number (two for a one-bit quantizer) of quantization levels introduces "quantization" noise into the system. The effect of oversampling and the use of an integrator feedback-loop in delta-sigma modulation are effective in shifting noise to out-of-band frequencies. The noise shifting properties and introduction of quantization error enables efficient use of subsequent filtering stages to remove noise and produce a more precise representation of the input at a much higher frequency. The delta sigma DACs can be employed to upconvert the input signal directly to radio transmission frequencies, such that further frequency conversion of the signals via conventional analog mixers is not required. The radio transmission frequencies can be in radio frequency (RF) ranges (e.g., megahertz range) or in microwave frequency ranges (e.g., gigahertz range).

Figure 2:
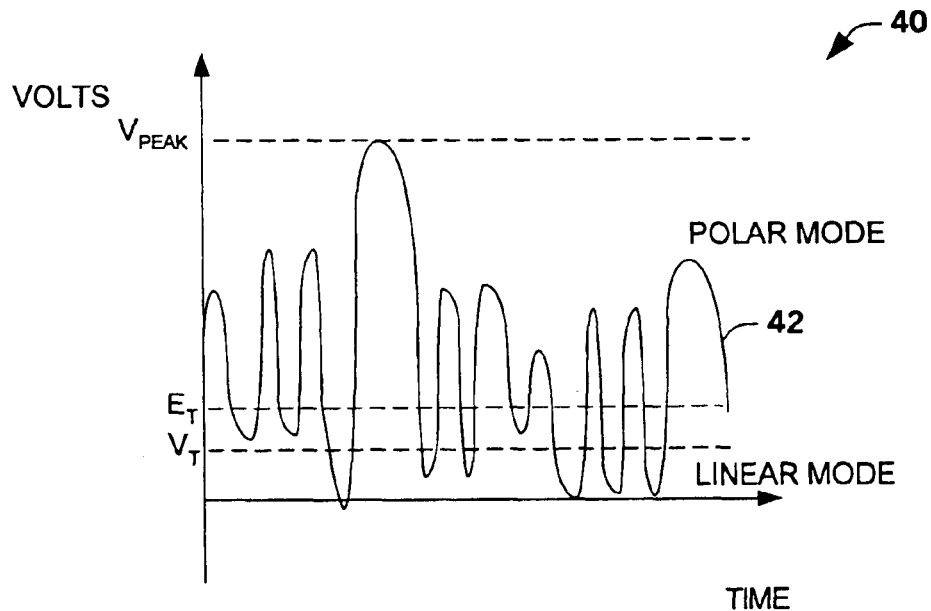
FIG. 2 illustrates a graph of voltage versus time of an exemplary composite input signal.

It is to be appreciated that the threshold level can be selected to achieve a desired efficiency, linearity and amplifier cost. FIG. 2 illustrates a graph 40 of voltage versus time of an exemplary composite input signal 42. The threshold level is selected to be an envelope amplitude voltage threshold level $V_T$. Additionally, the constant envelope amplitude of the phase modulated component $E_T$ can be selected to be greater than, less than or equal to the envelope amplitude voltage threshold level $V_T$. For high efficiency, the threshold level is also selected such that the envelope amplitude voltage level of the signal is at or above the amplitude voltage level substantially longer than the signal is at or below the envelope amplitude threshold voltage level $V_T$. Therefore, the amplifier system will operate in the polar mode substantially longer than in the linear mode. Since an amplifier is much more efficient in the polar mode than the linear mode, the overall amplifier is more efficient than a conventional linear amplifier.

Operating at or near saturation in the polar mode enables the use of a small power amplifier. Linear amplifiers are typically operated such that the maximum output power is less than the peak output power possible given the supply voltage. Accordingly, such amplifiers are larger and more costly than the equivalent amplifier used in the present invention. Its maximum output power is the same as the peak output power possible given the supply voltage. The linear mode region mitigates problems associated with low supply or drain voltage and zero crossing problems associated with polar amplifier operations.

Figure 3:
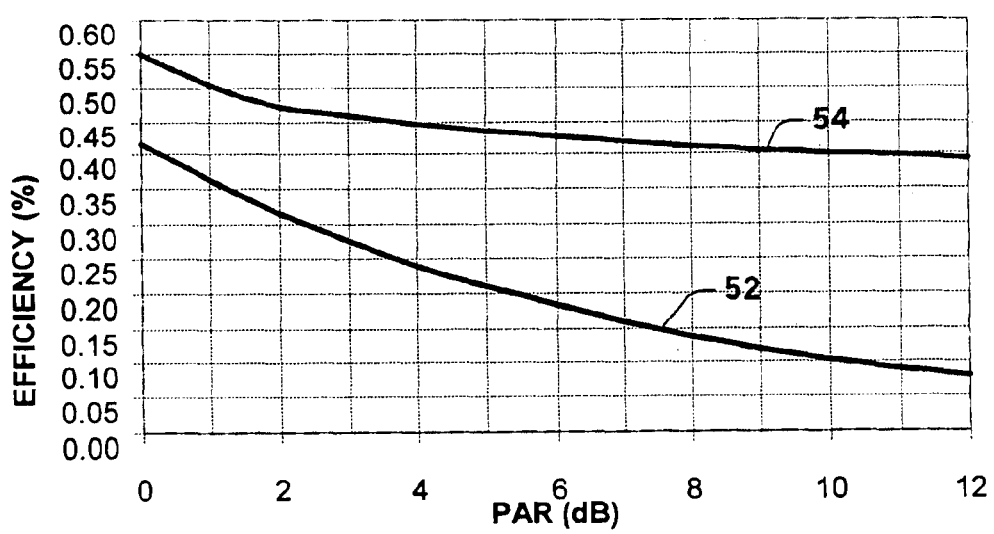
FIG. 3 illustrates a graph of efficiency versus peak-to-average ratio (PAR) of the signal waveform of an amplifier system of the present invention compared to a conventional linear amplifier system.

FIG. 3 illustrates a graph 50 of efficiency versus peak-to-average ratio (PAR) of the signal waveform of an amplifier system of the present invention compared to a conventional linear amplifier system. A curve 52 represents a plot of the efficiency versus the PAR of a conventional class A/B amplifier system, while the curve 54 represents the plot of efficiency versus PAR of an amplifier system in accordance with an aspect of the present invention (using a class A/B amplifier in both modes). The latest generation cellular systems have PAR levels of 8–12 dB that cause conventional designs to provide extremely low and costly efficiency levels. The maximum efficiency of a class A amplifier is 5% for a PAR value of 10 dB. The present invention provides both improved efficiency and low OOB emissions.

Figure 4:
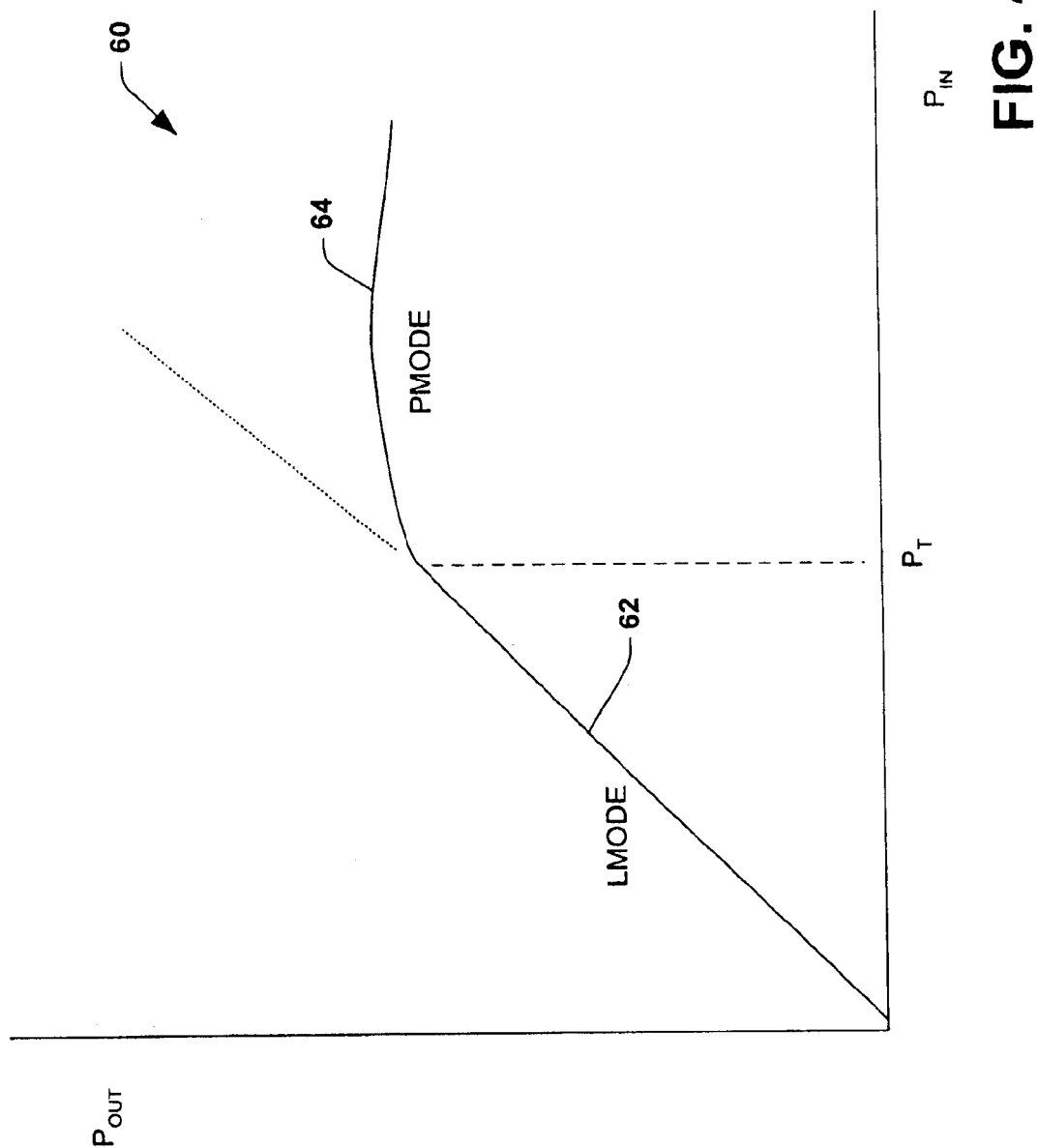
FIG. 4 illustrates a graph of power out versus power in of a power amplifier in accordance with an aspect of the present invention.

FIG. 4 illustrates a graph 60 of power out ($P_{OUT}$) versus power in ($P_{IN}$) of a power amplifier at a given supply voltage. As supply voltage is reduced this transfer curve is scaled so that the saturation point (the end of region 64) occurs at lower voltage levels. As illustrated in the graph 60, the power amplifier has a linear operation region 62 and a saturation region 64. The linear operation region 62 and the saturation region 64 are determined based on the characteristics of the power amplifier in addition to the selected supply or drain voltage. A threshold power level $P_T$ can be selected so that the amplifier operates in the linear mode (LMODE) along the linear operation region 62 of the power amplifier. In polar Mode (PMODE), the variable supply voltage ensures the amplifier system operates at saturation. The power amplifier size and threshold power level $P_T$ can be selected to provide a desired efficiency, linearity, bandwidth and acceptable OOB emissions.

For example, $P_T$ can be selected such that the amplifier system operates in the polar mode 90% of the time and in the linear mode 10% of the time. If the amplifier system is about 50–60% efficient in the polar mode and about 20–30% efficient in the linear mode, the entire amplifier system will have a composite efficiency of about 45–55%, which is a substantial improvement over a conventional linear amplifier. Therefore, the amplifier system provides substantially higher efficiency independent of the PAR value of the input signal. The bandwidth of the system is associated with the amplitude modulation of the amplifier system. That is the bandwidth of the modulation amplifier path has to be greater than or equal to the signal bandwidth. The bandwidth of the system can be reduced by limiting the time the amplifier system operates in polar mode (by increasing $P_T$).

The amplifier system of the present invention minimizes the complexity of the circuitry necessary to amplify a given input signal by performing many of the functions that create variables in the amplifier system in the digital domain. This also facilitates amplitude and phase modulation synchronization in the polar mode since many of the delays associated with convention polar amplifiers are mitigated. Additionally, the operation of the amplifier system can be further improved by employing linearization techniques in the digital domain.

Figure 5:
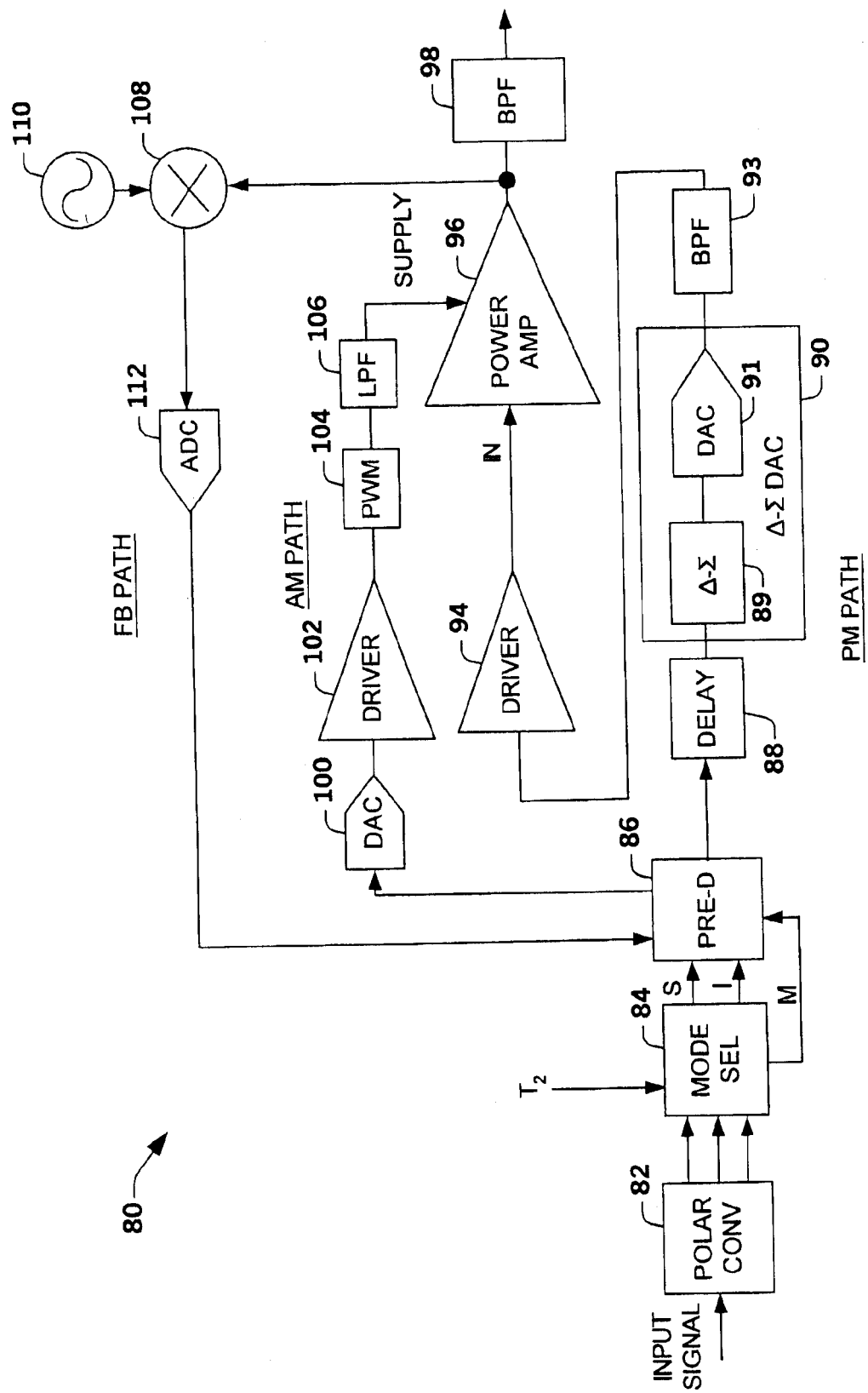
FIG. 5 illustrates a schematic block diagram of an amplifier system employing pre-distortion linearization techniques in accordance with an aspect of the present invention.

FIG. 5 illustrates an amplifier system 80 employing digital pre-distortion linearization techniques in accordance with an aspect of the present invention. Pre-distortion techniques are not available for conventional EER amplifiers using analog envelope detectors and limiters. Pre-distortion modifies the signals to reduce distortion in the amplifier chain as well as in the composite output signal. Determination of the initial pre-distortion gain and phase terms is typically performed off-line. The pre-distortion techniques of the present invention are employed in the digital domain, such that the digital input signal is modified prior to digital-to-analog conversion. Pre-distortion can be performed on the composite signal prior to separating the composite signal into amplitude and phase modulated components. Alternatively, pre-distortion can be performed on the composite signal, the amplitude modulated component and the phase modulated component separately according to the selected operating mode (e.g., polar mode, linear mode).

The amplifier system 80 includes a polar converter 82 that receives an input signal, for example, having amplitude and phase modulation. The polar converter 82 transforms the input signal into a polar composite signal, a polar amplitude modulated component and a polar phase modulated component. A mode selector 84 determines the operating mode (linear mode, polar mode) of the amplifier system 80. In the linear mode, the mode selector 84 transmits a composite signal and a substantially constant amplitude signal to a predistortion component 86. In the polar mode, the mode selector 84 transmits a phase modulated component of the composite signal and an amplitude modulated component of the composite signal to the predistortion component 86.

The mode selector 84 determines the mode of the amplifier system based on a characteristic of the input signal, such as envelope amplitude, with respect to a threshold level $T_2$. The mode selector 84 provides a supply signal that has a substantially constant amplitude (linear mode) or a supply signal that is amplitude modulated (polar mode) through a supply line (S) to the predistortion component 86. Concurrently, the mode selector 84 provides a composite signal (linear mode) or a constant envelope phase modulated component (polar mode) through an input line (l). The mode selector 84 also provides the predistortion component 86 with mode information through a mode line (M).

The predistortion component 86 employs the mode information to determine the desired predistortion to modify the input signal and the supply signal. For example, different predistortion is applied to the composite signal, the phase modulated component and the amplitude modulated component. It is to be appreciated that the predistortion component 86, the mode selector 84 and the polar converter 82 can be one or more digital hardware components and/or software algorithms.

The predistortion component 86 has a first output coupled to a digital-to-analog converter (DAC) 100 that converts the supply signal to an analog signal along an amplitude modulated (AM) path. A driver 102 is provided to buffer and add gain to the analog supply signal, which is then provided to a pulse width modulator 104. The pulse width modulator 104 cooperates with a low pass filter 106 to provide a Class-S type or Class-G type of amplifier/modulator. The pulses of the pulse width modulator 104 are integrated via the low pass filter 106 to provide an output that is a function of the width of the pulses from the pulse width modulator 104. The output of the low pass filter 106 is coupled to the supply terminal of the power amplifier 96.

The predistortion component 86 has a second output coupled to a delta-sigma DAC 90 through a delay component 88 along a phase modulated (PM) path. The delay component 88, which facilitates synchronization of the phase modulated component and amplitude modulated component during polar mode operation. The delta sigma DAC 90 includes a delta sigma modulator 89 coupled to a DAC 91. The DAC 91 can be a multi-bit DAC or a single-bit DAC. The output of the delta sigma DAC is coupled to a band pass filter 93.

The delta-sigma modulator 89 performs a digital-to-digital conversion or quantization of the input signal to provide a signal of lower resolution at a higher frequency. The DAC 91 then converts the quantized signal from the digital domain to the analog domain. The band pass filter 93 filters out noise associated with the quantization of the input signal. The delta sigma DAC 90 can be employed to convert the signal to radio transmission frequencies, so that the need for analog or digital mixers is not required. The output of the band pass filter 93 is then provided to a driver 94, which provides some additional gain to the input signal. The output of the driver 94 is then provided to the input terminal of the power amplifier 96 for amplification. The power amplifier 96 will generally be a linear amplifier (e.g., Class-A, Class-AB, Class-B). For some classes of input signal it can be a non-linear type amplifier (e.g., Class-C, Class-D, Class-E, Class-F). Amplifier selection criteria include desired performance, acceptable efficiency and acceptable OOB emissions.

The amplifier system 80 includes an optional feedback (FB) path from the output signal to the predistortion component 86 to compensate for variations in the system. The optional feedback path includes a mixer 108 and a local oscillator 110. The output signal is down-converted and digitized using a high dynamic range, highly linear ADC 112. The digitized values are compared to the expected signal parameters. Differences in measured and expected values are used to adapt the values used by the pre-distortion component 86. The adaptation is substantially slower than the signal and is primarily to account for temperature and aging changes in the system 80.

It is to be appreciated that optional taps (not shown) can be provided at the gate and drain inputs of the power amplifier 96 to calibrate and synchronize their relative delay. Additionally, an optional feedback path (not shown) from the output of the amplifier 96 can be provided for the AM path. In the optional feedback path, the output of the power amplifier would be passed through an analog envelope detector and sent to a small error amplifier after the DAC 100 in the AM Path to remove errors in the AM signal. An optional filter (not shown) can be provided on the output of the AM Path DAC 100 which may be required depending on the type of DAC (e.g., delta sigma DAC) utilized.

In the polar mode, the predistortion component 86 transmits the predistorted phase modulated component of the composite signal through the PM path and the predistorted amplitude modulated component of the composite signal through the AM path. The phase modulated component and amplitude modulated component are provided by the predistortion component 86 in digital form and converted to analog form to the input terminal and supply terminal, respectively, of the power amplifier 96. In the linear mode, the predistortion component 86 transmits the predistorted composite signal through the PM path and the optionally predistorted constant amplitude to the AM path. The composite signal and the constant amplitude signal are provided by the predistortion component 86 in digital form and converted to analog form to the input terminal and supply terminal, respectively, of the power amplifier 96. The output of the power amplifier 96 is then filtered by an optional band pass filter 98, such that amplified filtered output signal can be transmitted wireless or wired over a communication link.

Figure 6:
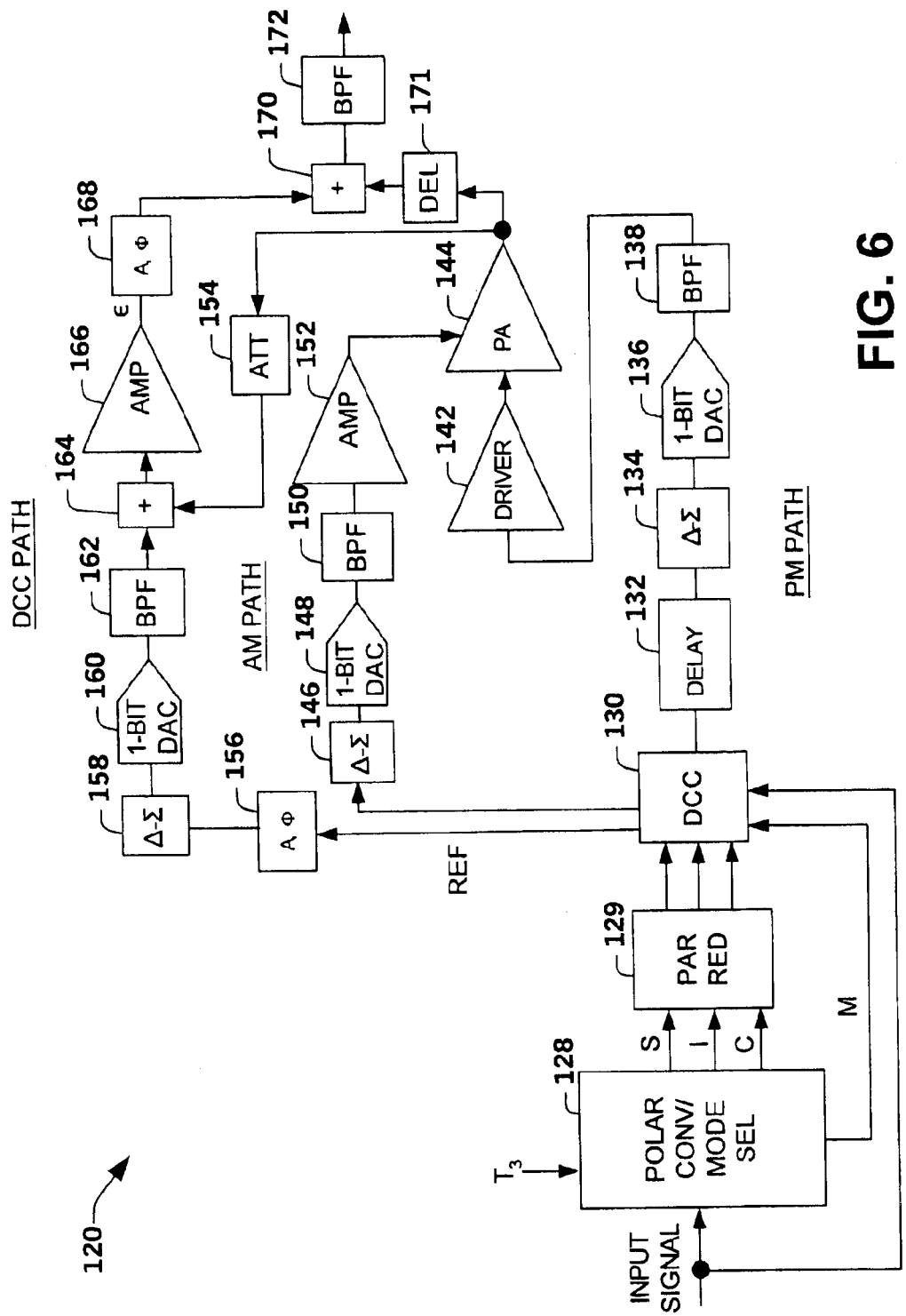
FIG. 6 illustrates a schematic block diagram of an amplifier system employing an alternate linearization technique in accordance with an aspect of the present invention.

FIG. 6 illustrates an amplifier system 120 employing an alternate linearization technique in accordance with an aspect of the present invention. The alternate technique is referred to as digital cross-cancellation and can be implemented alone or combined with the predistortion technique illustrated in FIG. 5. The digital cross-cancellation technique provides a separate digital copy of the wanted signal to be input to a separate DAC generating an undistorted or "clean" version of the wanted signal. The clean version of the wanted signal is inverted and combined with a portion of the output signal from a power amplifier to determine the error or unwanted portion of the output signal. The error signal is composed of distortions of the wanted signals and undesirable OOB emissions. The error signal is then inverted, scaled, and combined with a delayed version of the output signal to cancel the unwanted portion from the output signal. Typically, an amplifier system that separates a signal into components (e.g., a conventional EER amplifier) does not have a clean reference signal that can be used to provide linearization. The present invention provides for generation of a clean reference signal or an inverted version of a clean reference signal in the digital domain.

The DCC technique also provides the capability to clip the input signal and/or add or remove components to reduce peak signals. Therefore, smaller (less power capacity) and less costly power amplifiers can be employed to achieve similar performance and improved amplifier system efficiency as compared to amplifier systems with much larger less efficient power amplifiers.

A polar converter/mode selector 128 receives an input signal, for example, having amplitude and phase modulation. The polar converter/mode selector 128 transforms the input signal into a polar composite signal, a polar amplitude modulated component and a polar phase modulated component. The polar converter/mode selector 128 determines the operating mode (linear mode, polar mode) of the amplifier system 120 based on a threshold level $T_3$.

In the linear mode, the polar converter/mode selector 128 transmits a composite signal and a substantially constant amplitude signal to a PAR reduction component 129. In the polar mode, the polar converter/mode selector 128 transmits a phase modulated component of the composite signal and an amplitude modulated component of the composite signal to the PAR reduction component 129. The polar converter/ mode selector 128 provides a substantially constant amplitude supply signal (linear mode) or an amplitude modulated supply signal (polar mode) through a supply line (S) to the PAR reduction component 129. Concurrently, the polar converter/mode selector 128 provides a composite input signal (linear mode) or constant envelope phase modulated component of the composite input signal (polar mode) through an input line (I) to the PAR reduction component 129. The PAR reduction component 129 can reduce peak signal levels through clipping or include the addition of signals as well as pre-distortion of the composite signal and/or amplitude and phase terms to counter expected distortion.

The PAR reduction component 129 then passes the selected signals to a digital cross-cancellation component. The digital cross-cancellation component 130 generates a first digital output signal along a phase modulated (PM) path and a second digital output signal along an amplitude modulated (AM) path. The first digital output is one of the composite signal in the linear mode and a constant envelope phase modulated component of the composite signal in the polar mode, while the second digital output is one of a substantially constant amplitude signal in the linear mode and an amplitude modulated component in the polar mode. The digital cross-cancellation component 130 can add or remove signals to the first and second digital outputs to improve the performance of the amplifier system 120. The digital cross-cancellation component 130 also receives the original input signal prior to PAR reduction and generates a third digital output signal that is a clean reference signal (REF) associated with the desired output. It is to be appreciated that clean reference signal can be a representation of the desired output signal or an inverted representation of the desired output signal.

The first digital output signal is transmitted to a delta-sigma modulator 134 through a delay component 132. The delay component 132 facilitates synchronization of the phase modulated component and amplitude modulated component during polar mode operation, in addition to facilitating cross-cancellation of the final output signal. The delta sigma modulator 134 is coupled to a 1-bit DAC 136 and a band pass filter 138. The delta-sigma modulator 134, the 1-bit DAC 136 and the band pass filter 138 cooperate to perform a digital-to-analog conversion directly to radio transmission frequencies. A one-bit converter provides analog conversion with extremely high linearity (low distortion). The output of the band pass filter 138 is then provided to a driver 142, which provides additional gain to the analog input signal. The output of the driver 142 is then provided to the input terminal of the power amplifier 144 for amplification. The power amplifier 144 can be a linear amplifier (e.g., Class-A, Class-AB, Class-B) or, for some classes of input signal, it can be a non-linear type amplifier (e.g., Class-C, Class-D, Class-E, Class-F) based on desired performance, acceptable efficiency and acceptable OOB emissions.

The second digital output is transmitted to a delta-sigma modulator 146. The delta sigma modulator 146 is coupled to a 1-bit DAC 148 and a band pass filter 150. The delta-sigma modulator 146, the 1-bit DAC 148 and the band pass filter 150 cooperate to perform a digital-to-analog conversion directly to radio transmission frequencies. The output of the band pass filter is then provided to a modulation amplifier 152 (e.g., Class-S, Class-G). The output of the modulation amplifier 152 is coupled to the supply terminal of the power amplifier 144 to provide the desired amplitude modulation in the polar mode and substantially constant supply voltage in the linear mode.

The digital cross-cancellation component 130 provides the third digital signal along a DCC path to a digital phase inverter 156. The third digital signal is a reference version (REF) of the input signal corresponding to the desired amplified output signal prior to any modifications. Alternatively, the digital inverter 156 can be eliminated and the inverted version of the clean reference signal can be provided by the digital cross-cancellation component 130. The inverted clean reference signal is transmitted to a delta-sigma modulator 158. The delta sigma modulator 158 is coupled to a 1-bit DAC 160 and a band pass filter 162. The delta-sigma modulator 158, the 1-bit DAC 160 and the band pass filter 162 cooperate to perform a digital-to-analog conversion directly to radio transmission frequencies of the inverted version of the clean reference signal (REF). A small portion of the power amplifier output is split off by a coupler through an attenuator 154 and summed with the inverted clean reference signal through a summer 164. The output of the summer 164 is signal distortion and OOB emissions. The output of the summer 164 is amplified by an error amplifier 166 to produce an error signal ($\epsilon$). The error signal is inverted through an inverter 168 to provide an inverted error signal. The inverted error signal is recombined with a delayed version of the output of the power amplifier 144 via a delay component 171 through a summer 170 to remove OOB emissions and reduce distortion levels. The output of the summer 170 is then provided to an optional band pass filter 172 which filters out any remaining unwanted signals outside the desired transmission band.

The digital cross-cancellation technique in accordance with an aspect of the present invention can supply correction for amplifier distortions and it can correct spectral splatter that occurs from intentional clipping of the wanted signals performed to allow for amplifier size reduction (e.g., amplifiers in the AM and PM paths are sized to according to the peak signals). Additionally, since a digital reference signal is employed to determine the desired correction at the output, any modification of the signal can be corrected at the final output stage without the need for additional correction information during the amplification process.

Figure 7:
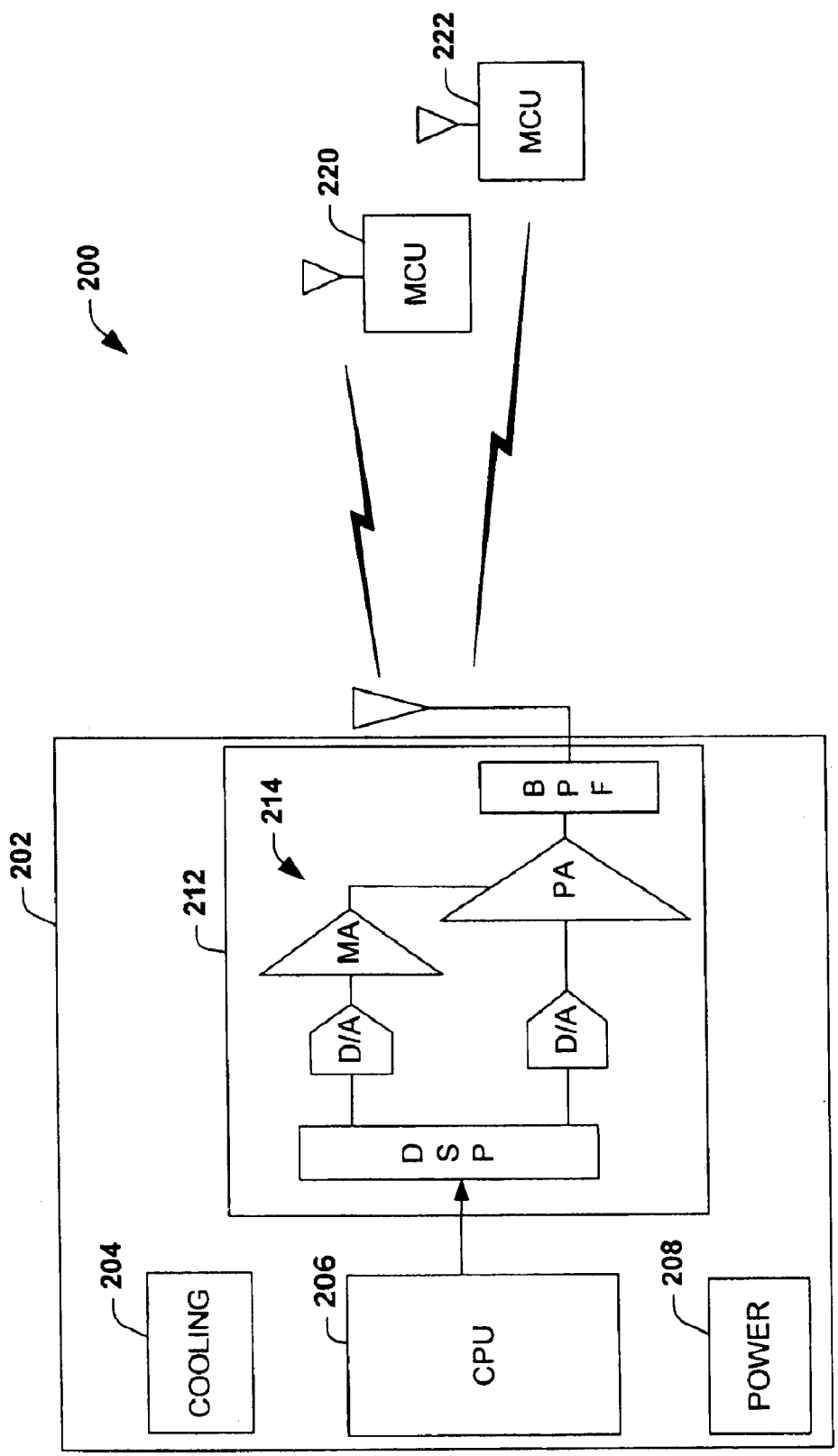
FIG. 7 illustrates a block diagram of a communication system in accordance with an aspect of the present invention.

The amplifier system of the present invention can be employed in a number of applications. The amplifier system can be employed in wireless transmitter applications for base stations (e.g., satellites, cellular), handsets, and other mobile communication devices. FIG. 7 illustrates a communication system 200 having a base station 202 with a transmitter 212 employing an amplifier system 214 (dual polar-linear mode i.e., POLINEAR™ operation) in accordance with an aspect of the present invention. The amplifier system 214 that employs a DSP to operate the amplifier system 214 in a linear mode when envelope signals are at or below a threshold level and in a polar mode when envelope signals are above a threshold level.

A central processing unit (CPU) 206 is coupled to the DSP of the amplifier 214. The CPU 206 can facilitate control and threshold selection of the amplifier system 214. For example, the CPU 206 can generate the type of signal (e.g., WCDMA, GSM, OFDM) to be transmitted and select the threshold level in which the amplifier switches between polar mode and linear mode. The base station 202 communicates to a group of mobile communication unit (MCUs) comprised of MCUs 220 and 222. The MCUs 220 and 222 are for illustrative purposes and it should be appreciated that the group of MCUs can include a greater number of MCUs based on the number of carriers in the output signal.

The base station 202 also includes cooling devices 204 and power devices 208. The power devices 208 can include AC-DC conversion and battery backup devices that protect the base station 202 from power loss failures. The power devices 208 and cooling devices 204 can be substantially reduced in size and cost compared to conventional devices since the amplifier system of the present invention operates with substantially more efficiently than conventional amplifier systems. Although the base station 202 is illustrated as having a single transmitter 212, the base station 202 can have a plurality of transmitters communicating to different respective groups of MCUs over similar communication signal standards or different communication signal standards. Additionally, the MCUs 220 and 222 can also include transmitters with amplifier systems that operate in a linear mode and polar mode similar to that described for the transmitter 212.

Figure 8:
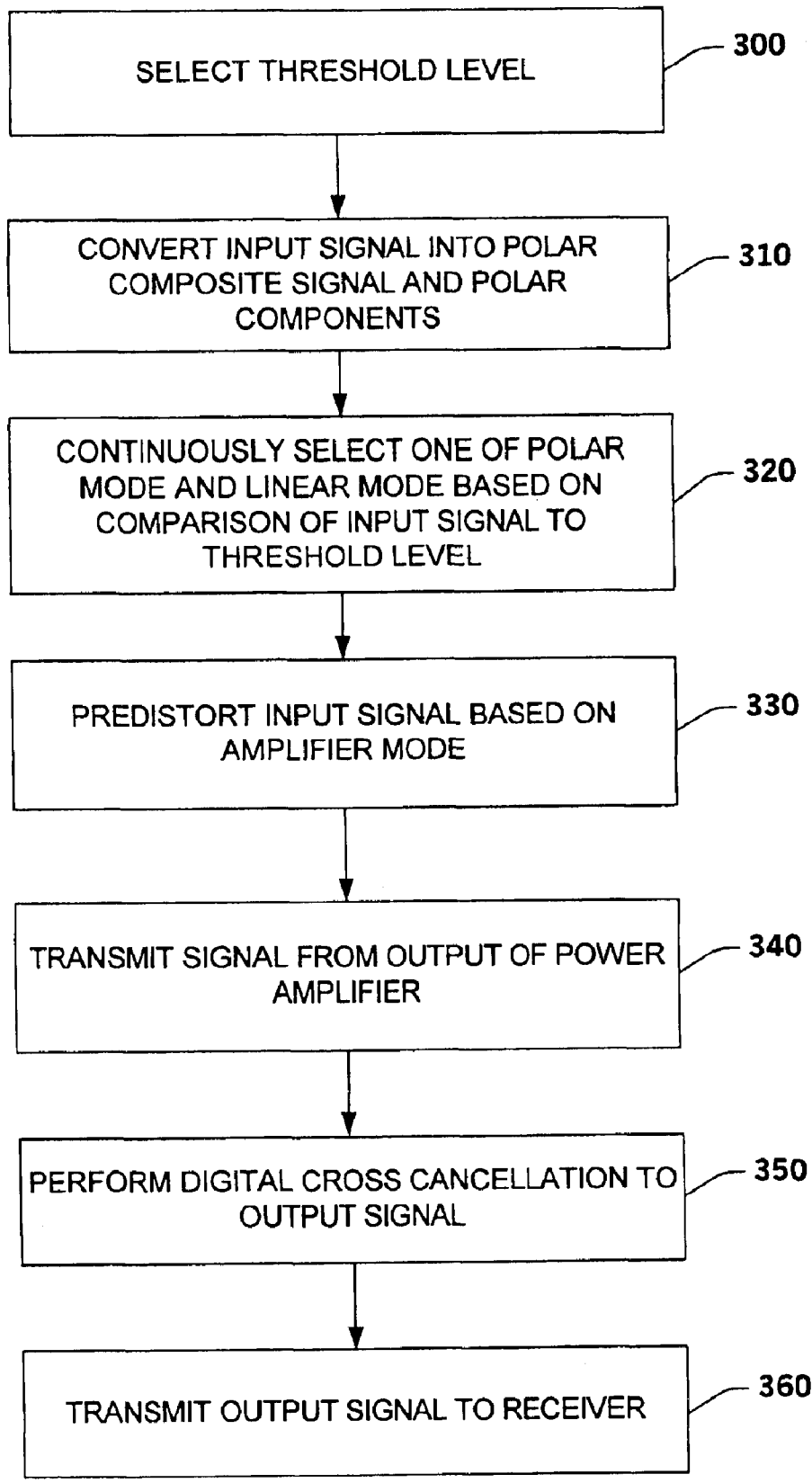
FIG. 8 illustrates a methodology for operating an amplifier system in accordance with an aspect of the present invention.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 8 illustrates a methodology for operating an amplifier system having a power amplifier with a supply terminal and an input terminal in accordance with an aspect of the present invention. The methodology begins at 300 where a threshold level is selected. The threshold level can be, for example, an envelope amplitude level in which the amplifier system operates in a polar mode at envelope amplitude levels that are above, or at or above, the threshold level, and in a linear mode at envelope amplitude levels at or below, or below, the threshold level. At 310, the input signal is converted into a polar composite signal, and amplitude and phase modulated components of the polar composite signal. The input signal can be in a number of different single carrier or multi-carrier amplitude and/or phase modulated signal formats (e.g., WCDMA, GSM, OFDM).

At 320, the amplifier system continuously selects operation in the polar mode or linear mode based on a comparison of the input signal to a threshold level. For example, the threshold level can be a signal amplitude level and the polar mode selected for envelope amplitudes of the input signal level being above, at or below a selected envelope amplitude threshold level. It is to be appreciated that other signal characteristics can be employed to determine at which portion of the input signal that the amplifier system operates in a polar mode and at which portion of the input signal that the amplifier system operates in a linear mode.

During the polar mode, an amplitude modulated component of the composite signal is transmitted to the supply terminal of the power amplifier, and a constant envelope phase modulated component is transmitted to the input of the power amplifier. During the linear mode, a substantially constant voltage amplitude signal is transmitted to the supply terminal of the power amplifier, and the composite signal is transmitted to the input of the power amplifier. The power amplifier input signal and the power amplifier supply signal can be transmitted in digital format, and converted into the analog domain via respective DACs (e.g., delta-sigma modulated DACs). The amplifier supply signal is then amplified, for example, employing a Class-S or Class-G amplifier/modulator, prior to being provided to the supply terminal of the power amplifier.

At 330, the power amplifier supply signal and the power amplifier input signal are predistorted based on the amplifier mode. Predistortion modifies the amplitude and/or phase of the input signal to counter anticipated unwanted distortion. The predistortion is combined with the amplitude modulated component and the constant envelope phase modulated component in the polar mode, separately, from the predistortion that is combined with the composite signal in the linear mode. The predistortion can be combined with the signal components in the digital domain prior to conversion of the signal components into the analog domain. The signal is then transmitted to the output of the power amplifier at 340. At 350, digital cross-cancellation is performed on the output of the power amplifier. The digital cross-cancellation technique provides a digital reference to a separate DAC generating a "clean" version of the wanted signal. The clean version of the wanted signal is inverted and combined with an attenuated version of the actual output signal from the power amplifier to determine the unwanted portion of the output signal. The unwanted portion of the input signal is then inverted, amplified, and combined with a delayed version of the output of the power amplifier to cancel the unwanted portion from the output signal. At 360, the predistorted, digitally cross-cancelled recombined signal is transmitted to one or more destination receivers.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An amplifier system comprising:
    a power amplifier operative to amplify an input signal, the power amplifier being a linear class type amplifier that operates as a constant class amplifier; and
    a mode selector that controls the operation of the amplifier between a polar mode and a linear mode based on a characteristic of the input signal relative to a threshold level.

2. The system of claim 1, the power amplifier having an input terminal and a supply terminal, the mode selector transmits a phase modulated signal component of the input signal to the input terminal and an amplitude modulated signal component of the input signal to the supply terminal during polar mode operation, and the mode selector transmits a composite signal component to the input terminal and a substantially constant amplitude signal component to the supply terminal during linear mode operation.

3. The system of claim 1, the input signal being a phase and/or amplitude modulated signal and the threshold level being an envelope amplitude level associated with the input signal, the power amplifier operates in the polar mode at input signal envelope amplitude levels above the threshold level and in a linear mode at input signal envelope amplitude levels below the threshold level.

4. The system of claim 1, the mode selector having a first output coupled to an input terminal of the power amplifier through a first digital-to-analog converter (DAC) and a second output coupled to a supply terminal of the power amplifier through a second DAC and a modulation amplifier, the mode selector transmits digital representations of an amplifier input signal component and an amplifier supply signal component to the first and second DACs, respectively, which convert the digital representations into analog signals.

5. The system of claim 4, at least one of the first and second DACs being delta-sigma DACs, such that the digital representations of at least one of the amplifier input signal component and the supply signal component are converted into the analog domain directly at a desired radio transmission frequency.

6. The system of claim 4, the modulation amplifier being one of a Class-S type and a Class-G type modulator.

7. The system of claim 1, further comprising a precistortion component that modifies one of a composite signal component of the input signal and polar components of the input signal to mitigate output distortion of the power amplifier.

8. The system of claim 1, further comprising a digital cross-cancellation component that generates a reference signal corresponding to a desired output signal of the amplifier system, the clean reference signal being combined with a portion of an output signal from the power amplifier to determine an error signal, the error signal being inverted and combined with a delayed version of the output signal of the power amplifier to generate a final output signal.

9. The system of claim 8, the reference signal being provided to a delta sigma digital-to-analog converter (DAC) to convert the reference signal from the digital domain to the analog domain directly to a desired radio transmission frequency.

10. The system of claim 8, further comprising a peak-to-average reduction (PAR) component that removes large peaks signals from the input signal, the digital cross-cancellation component adding the large peak signals back to the final output signal.

11. The system of claim 1, further comprising a feedback path to compensate for variations in age and temperature of the amplifier system.

12. A transmitter comprising the amplifier system of claim 1.

13. A base station comprising the transmitter of claim 12.

14. An amplifier system comprising:
a power amplifier;
a modulation amplifier having an output coupled to a supply terminal of the power amplifier;
a first digital-to-analog converter (DAC) coupled to an input terminal of the power amplifier;
a second DAC coupled to the input terminal of the modulation amplifier; and
a digital system having a first output coupled to an input of the first DAC and a second output coupled to the input of the second DAC, the digital system controls the operation of the amplifier system between a polar mode and a linear mode based on a characteristic of the input signal relative to a threshold level.

15. The system of claim 14, the digital system transmits a phase modulated component of an input signal to the input terminal of the power amplifier and an amplitude modulated component of the input signal to the supply terminal during the polar mode, and the digital system transmits a composite component of the input signal to the input terminal of the power amplifier and a substantially constant amplitude signal to the supply terminal of the power amplifier during the linear mode.

16. The system of claim 15, the input signal being a phase and amplitude modulated signal and the threshold level being an envelope amplitude level, the amplifier system operates in the polar mode at input signal amplitude levels above the threshold level and in the linear mode at envelope amplitude levels below the threshold level.

17. The system of claim 14, at least one of the first and second DACs being delta-sigma modulated DACs, such that digital signals provided to at least one of the first and second DACs are converted into the analog domain directly at a desired radio transmission frequency.

18. The system of claim 14, the modulation amplifier being one of a Class-S type and a Class-G type modulator and the power amplifier being a linear class type amplifier.

19. The system of claim 14, further comprising a predistortion component that modifies signals provided to the power amplifier to mitigate output distortion of the power amplifier, and a digital cross-cancellation component that generates a reference signal corresponding to a desired output signal of the amplifier system, the clean reference signal being combined with a portion of an output signal from the power amplifier to determine an error signal, the error signal being inverted and combined with a delayed version of the output signal of the power amplifier to generate a final output signal.

20. An amplifier system comprising:
means for amplifying a phase and amplitude modulated input signal;
means for switching operation of the amplifier system between a polar mode and a linear mode based on a characteristic of the input signal relative to a threshold level; and
means for converting at least a portion of the input signal from the digital domain to the analog domain directly to a desired radio transmission frequency.

21. The system of claim 20, further comprising means for converting the input signal into a polar representation of the input signal, the polar representation comprising a composite signal component having an amplitude modulated component and a phase modulated component, the amplitude modulated component supplying the means for amplifying and the phase modulated component being amplified by the means for amplifying during the polar mode, and the means for amplifying being supplied by a constant amplitude signal and the composite signal component being amplified by the means for amplifying in the linear mode.

22. The system of claim 20, further comprising means for modifying the input signal and means for modifying the output signal to facilitate amplifier system efficiency and mitigate out-of-band (OOB) emissions.

23. A method of amplifying an input signal with a power amplifier, the method comprising:
switching a mode of the power amplifier between polar mode operation and linear mode operation based on a characteristic of the input signal relative to a threshold level;

transmitting a phase modulated component of the input signal to an input terminal of a power amplifier and an amplitude modulated component of the input signal to a supply terminal of the power amplifier during polar mode operation, and transmitting a composite signal to the input terminal and a constant amplitude component to the supply terminal during linear mode operation; and amplifying the input signal via the power amplifier while continuously switching modes between polar mode operation and linear mode operation.

24. The method of claim 23, further comprising transmitting the amplified input signal to at least one receiver.

25. The method of claim 23, further comprising converting at least a portion of the input signal from the digital domain to the analog domain directly to a desired radio transmission frequency prior to providing at least a portion of the input signal to the power amplifier.

26. The method of claim 23, further comprising at least one of modifying the input signal and modifying the output signal to facilitate the efficiency and mitigate out-of-band (OOB) emissions of the power amplifier.

27. The method of claim 23, the threshold level being an envelope amplitude level.

* * * * *